United States Patent
Wang et al.

(10) Patent No.: US 12,283,343 B2
(45) Date of Patent: Apr. 22, 2025

(54) IMS MEMORY CELL, IMS METHOD AND IMS MEMORY DEVICE

(71) Applicant: MACRONIX INTERNATIONAL CO., LTD., Hsinchu (TW)

(72) Inventors: Yun-Yuan Wang, Kaohsiung (TW); Cheng-Hsien Lu, Taoyuan (TW); Po-Hao Tseng, Taiping Dist. (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 387 days.

(21) Appl. No.: 18/064,303

(22) Filed: Dec. 12, 2022

(65) Prior Publication Data

US 2024/0194229 A1    Jun. 13, 2024

(51) Int. Cl.
*G11C 7/10* (2006.01)
*G11C 7/14* (2006.01)
*G11C 8/08* (2006.01)

(52) U.S. Cl.
CPC .............. *G11C 7/1069* (2013.01); *G11C 7/14* (2013.01); *G11C 8/08* (2013.01)

(58) Field of Classification Search
CPC ........... G11C 7/14; G11C 7/1069; G11C 8/08; G11C 15/046; G11C 15/04
See application file for complete search history.

(56) References Cited

U.S. PATENT DOCUMENTS

| | | | | |
|---|---|---|---|---|
| 5,877,714 A | * | 3/1999 | Satoh | H03M 7/3086 |
| | | | | 707/E17.035 |
| 6,069,573 A | * | 5/2000 | Clark, II | G11C 15/04 |
| | | | | 711/108 |
| 8,576,622 B2 | | 11/2013 | Yoon et al. | |
| 9,946,468 B2 | | 4/2018 | Conley et al. | |
| 2004/0250013 A1 | * | 12/2004 | Ogura | G06F 16/90339 |
| | | | | 711/108 |

FOREIGN PATENT DOCUMENTS

| CN | 102479556 A | 5/2012 |
|---|---|---|
| CN | 105679364 A | 6/2016 |

OTHER PUBLICATIONS

Wang, et al.: "A New Read-Disturb Failure Mechanism Caused by Boosting Hot-Carrier Injection Effect in MLC NAND Flash Memory"; 978-1-4244-3761-0/09/$25.00 © 2009 IEEE; pp. 1-2.
Tseng, et al.: "In-Memory-Searching Architecture Based on 3D-NAND Technology with Ultra-high Parallelism"; 978-1-7281-8888-1/20/$31.00 © 2020 IEEE; pp. 1-4.

* cited by examiner

*Primary Examiner* — Uyen Smet
(74) *Attorney, Agent, or Firm* — McClure, Qualey & Rodack, LLP (57) ABSTRACT

The disclosure provides an in-memory search (IMS) memory cell, an IMS method and an IMS memory device. The IMS method comprises: encoding a search data and a storage data by a first IMS encoding into a first IMS encoded search data and a first IMS encoded storage data; encoding the first IMS encoded search data by a second IMS encoding into a plurality of search voltages; encoding the first IMS encoded storage data by the second IMS encoding into a plurality of threshold voltages of a plurality of memory cells of a plurality IMS memory cells of the IMS memory device; and searching the IMS memory cells by the search voltages to generate a search result.

18 Claims, 10 Drawing Sheets

Adding dummy bit

0110011  ~210

Grouping in two bits

01100110

Generating encoded data string

FIG. 5B (THE EMBODIMENT)

IMS MEMORY CELL, IMS METHOD AND IMS MEMORY DEVICE

TECHNICAL FIELD

The disclosure relates in general to an in-memory search (IMS) memory cell, an IMS method and an IMS memory device.

BACKGROUND

Along with rise of big data and artificial intelligent (AI) hardware accelerator, data search and data comparison are important functions. The current content addressable memory (CAM) may implement highly parallel searching.

A content-addressable memory (CAM) compares a search data against storage data in a highly parallel manner.

In in-memory search (IMS), if the bias voltage difference between adjacent word lines is large, transverse electric field effects are induced to cause hot carrier injection (HCI) effect, which shifts the threshold voltages of the memory cells and degrades storage data of the memory cells. Further, when 3D memory devices have more memory layers or higher storage density, shift of the threshold voltages of the memory cells and read failure of storage data of the memory cells are worse.

Figure 1A:
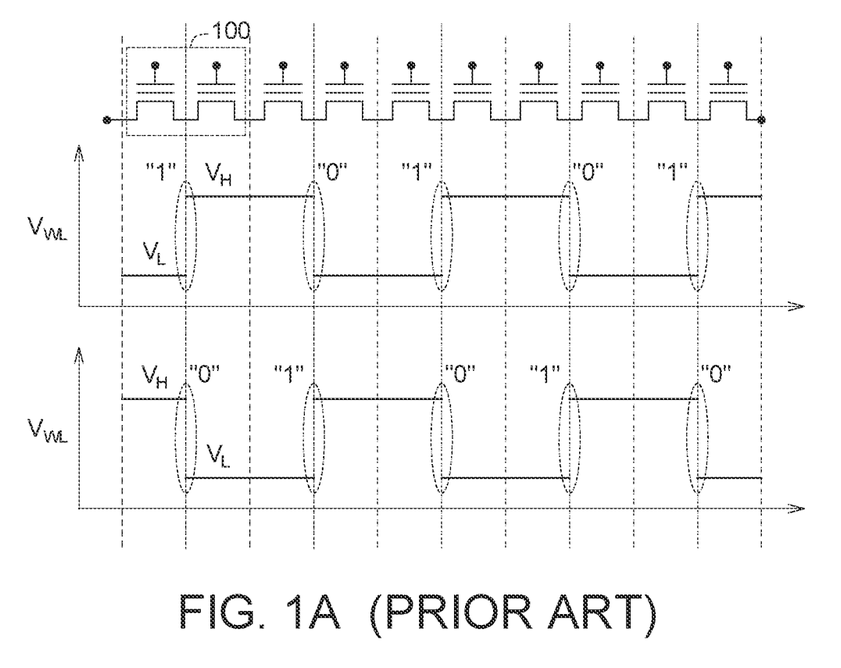
FIG. 1A and FIG. 1B show transverse electric field in the prior art.
Figure 1B:
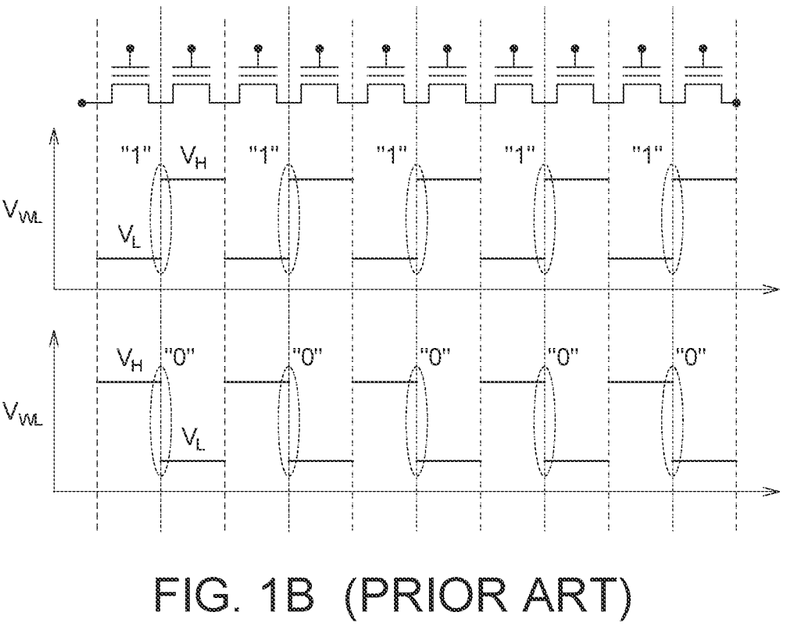

FIG. 1A and FIG. 1B show transverse electric field in the prior art. VWL refers to the word line voltages, having high voltage $V_H$ and low voltage $V_L$. The HCl effect in the case that the IMS memory cells 100 store "10101" or "01010" (as shown in FIG. 1A) is less than the case that the IMS memory cells 100 store "111111" or "00000" (as shown in FIG. 1B). This is because, in the IMS memory cells 100 of FIG. 1A, the stagger pattern of the high voltage $V_H$ and the low voltage $V_L$ is not severe. However, in the IMS memory cells 100 of FIG. 1B, the stagger pattern of the high voltage $V_H$ and the low voltage $V_L$ is severe.

Thus, it is an effort to reduce the transverse electric field effects and the hot carrier injection (HCI) effects for further improving shift of the threshold voltages of the memory cells and read failure of storage data of the memory cells during IMS.

SUMMARY

According to one embodiment, an in-memory search (IMS) memory cell is provided. The IMS memory cell comprises: a first memory cell and a second memory cell coupled to each other, the first memory cell and the second memory cell having a first threshold voltage and a second threshold voltage, respectively, the first memory cell and the second memory cell coupled to a first word line and a second word line, respectively. A search data and a storage data are encoded by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data. The first IMS encoded search data is encoded by a second IMS encoding into a plurality of search voltages. The first IMS encoded storage data is encoded by the second IMS encoding into the first threshold voltage and the second threshold voltage. The IMS memory cell is searched by the search voltages to generate a search result.

According to another embodiment, an in-memory search (IMS) method applied to an IMS memory device is provided. The IMS method comprises: encoding a search data and a storage data by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data; encoding the first IMS encoded search data by a second IMS encoding into a plurality of search voltages; encoding the first IMS encoded storage data by the second IMS encoding into a plurality of threshold voltages of a plurality of memory cells of a plurality IMS memory cells of the IMS memory device; and searching the IMS memory cells by the search voltages to generate a search result.

According to an alternative embodiment, an in-memory search (IMS) memory device is provided. The IMS memory device comprises: an IMS memory array including a plurality of IMS memory cells; a first encoder coupled to the IMS memory array, the first encoder receiving a search data and encoding the search data into a plurality of search voltages, the search voltages applied to the IMS memory cells to search the IMS memory cells; and a second encoder coupled to the IMS memory array, based on a plurality of sensing currents from the IMS memory cells, the second encoder determining whether the search data is matched with a storage data of the IMS memory cells. The search data and the storage data are encoded by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data. The first IMS encoded search data is encoded by a second IMS encoding into the plurality of search voltages. The first IMS encoded storage data is encoded by the second IMS encoding into a plurality of threshold voltages of a plurality of memory cells of the plurality IMS memory cells. The IMS memory cells are searched by the search voltages to generate a search result.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

In one embodiment of the application, in order to reduce the transverse electric field effects and the hot carrier injection (HCI) effects for further improving shift of the threshold voltages of the memory cells and degrade of storage data of the memory cells during IMS, the search data and the storage data are encoded twice. Details of the twice encoding are described.

Figure 2A:
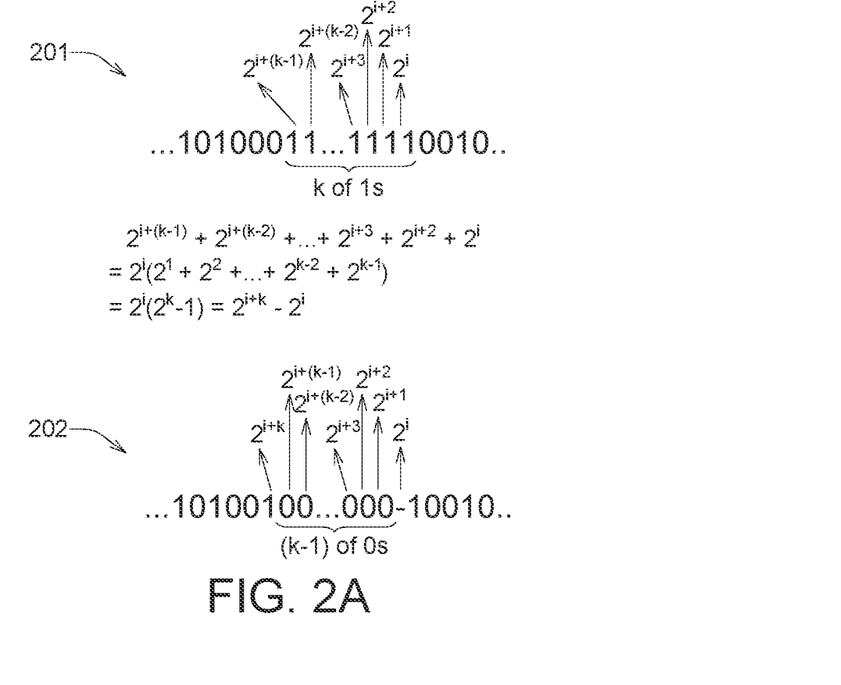
FIG. 2A and FIG. 2B show to convert continuous logic "1" data string into continuous logic "0" data string by 2's complementary notation.
Figure 2B:
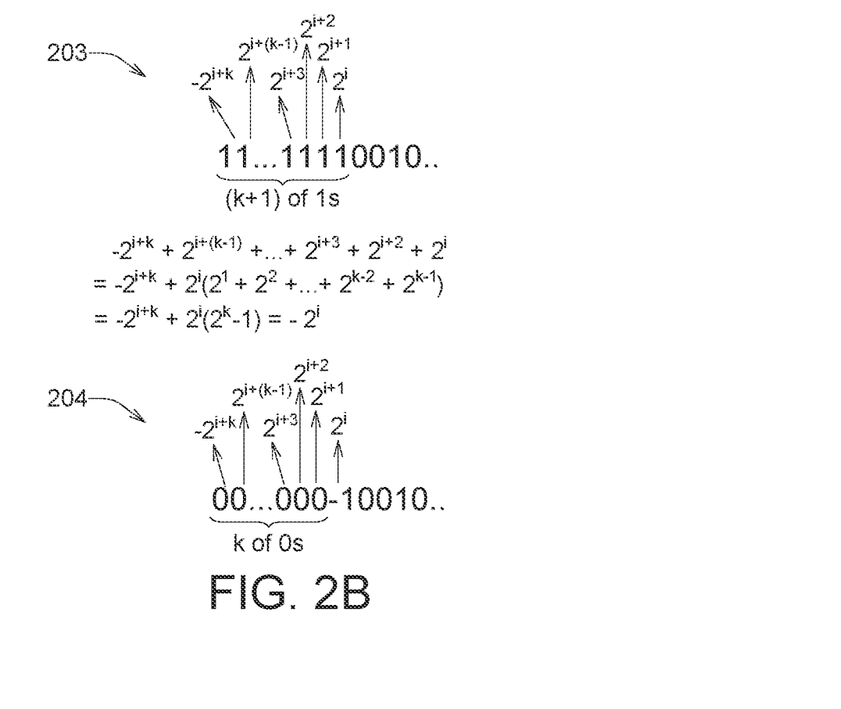
Figure 2C:
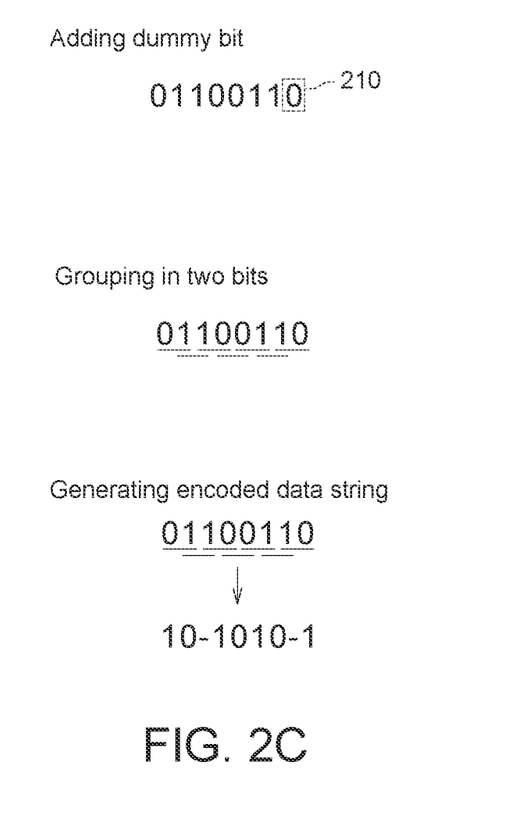
FIG. 2C shows first IMS encoding according to one embodiment of the application.

FIG. 2A and FIG. 2B show to convert continuous logic "1" data string into continuous logic "0" data string by 2's complementary notation. FIG. 2C shows first IMS encoding according to one embodiment of the application.

When the number "6" is expressed in decimal, the number "6" is expressed as $(6)_{10}=(8)_{10}+(-2)_{10}$.

When the number "6" is expressed in binary, the number "6" is expressed as $(0110)_2=(1000)_2+(00\text{-}10)_2$.

In FIG. 2A, the continuous k (k being a natural number) logic "1" bits are in the middle of the data string 201. In 2's complementary notation, the continuous k logic "1" bits are expressed as (i being a natural number):

$$2^{i+(k-1)}+2^{i+(k-2)}+\ldots+2^{i+3}+2^{i+2}+2^i=2^i(2^1+2^2+\ldots+2^{k-2}+2^{k-1})=2^i(2^k-1)=2^{i+k}-2^i$$

Thus, in FIG. 2A, by 2's complementary notation, the continuous k logic "1" bits in the middle of the data string 201 are converted into the continuous (k−1) logic "0" bits and then a logic "1" bit and a logic "−1" bit are added before and after the continuous (k−1) logic "0" bits, respectively. By so, the data string 201 is converted into the data string 202.

In FIG. 2A, the continuous k logic "1" bits are in the head of the data string 203. In 2's complementary notation, the continuous k logic "1" bits are expressed as:

$$-2^{i+k}+2^{i+(k-1)}+\ldots+2^{i+3}+2^{i+2}+2^i=-2^{i+k}+2^i(2^1+2^2+\ldots+2^{k-2}+2^{k-1})=-2^{i+k}+2^i(2^k-1)=-2^i$$

Thus, in FIG. 2B, by 2's complementary notation, the continuous k logic "1" bits in the head of the data string 203 are converted into the continuous k logic "0" bits and then a logic "−1" bit is added after the continuous k logic "0" bits. By so, the data string 203 is converted into the data string 204.

In the step for adding a dummy bit in FIG. 2C, a dummy bit 210 is added at the tail of the data string. The dummy bit 210 is for example but not limited by, a logic "0" bit, which is not to limit the application. For example, the data string is "0110011" and after adding the dummy bit 210 at the tail of the data string, the data string becomes "01100110".

In the step for grouping by two-bit in FIG. 2C, the data string added with the dummy bit 210 is grouped into a plurality of bit groups by two-bit, wherein the first bit and the second bit of the data string added with the dummy bit 210 are grouped into a first bit group; the second bit and the third bit of the data string added with the dummy bit 210 are grouped into a second bit group and so on. That is, if the data has j bits (j being a natural number), then the data string added with the dummy bit 210 has (j+1) bits. After grouping, the data string added with the dummy bit 210 (having (j+1) bits) is grouped into j bit groups. That is, in grouping, the i-th bit ("i" being a natural number) and the (i+1)-th bit are grouped into the i-th bit group, wherein i=1~j. For example, as for the data string 01100110, the first bit and the second bit are grouped into a bit group (01); the second bit and the third bit are grouped into a bit group (11), and so on.

In the encoding step in FIG. 2C, each of the bit groups (Yn+1, Yn) are encoded into the encoded data. The implementation of encoding is for example but not limited by, encoding "00" into "0", encoding "01" into "1", encoding "10" into "−1" and encoding "11" into "0". Encoding is as follows:

| Yn + 1 | Yn | Encoded data |
| --- | --- | --- |
| 0 | 0 | 0 |
| 0 | 1 | 1 |
| 1 | 0 | −1 |
| 1 | 1 | 0 |

In the step for generating the encoded data string in FIG. 2C, the encoded data string (also referred a first IMS encoded data string) is generated, wherein the encoding data string also has j bits. For example but not limited by, the data string 01100110 (before adding the dummy bit) is encoded into "10-1010-1". The bit groups are encoded into the first IMS encoded data string. When the bit group is "00", the bit group is encoded into "0"; when the bit group is "01", the bit group is encoded into "1"; when the bit group is "10", the bit group is encoded into "−1"; and when the bit group is "11", the bit group is encoded into "0".

That is, in one embodiment of the application, the data string 201 and 203 of FIG. 2A and FIG. 2B are encoded into the data string 202 and 204 by the first IMS encoding in FIG. 2C. By the first IMS encoding, continuous logic 1 bits in the data string are converted into continuous logic 0 bit, for reducing high voltage difference between adjacent word lines, in order to reduce the transverse electric field effects and the hot carrier injection (HCI) effects for further improving shift of the threshold voltages of the memory cells and degrade of storage data of the memory cells.

Figure 3A:
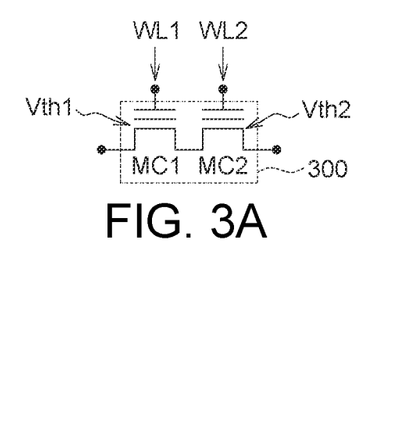
FIG. 3A and FIG. 3B show a second IMS encoding according to one embodiment of the application.
Figure 3B:
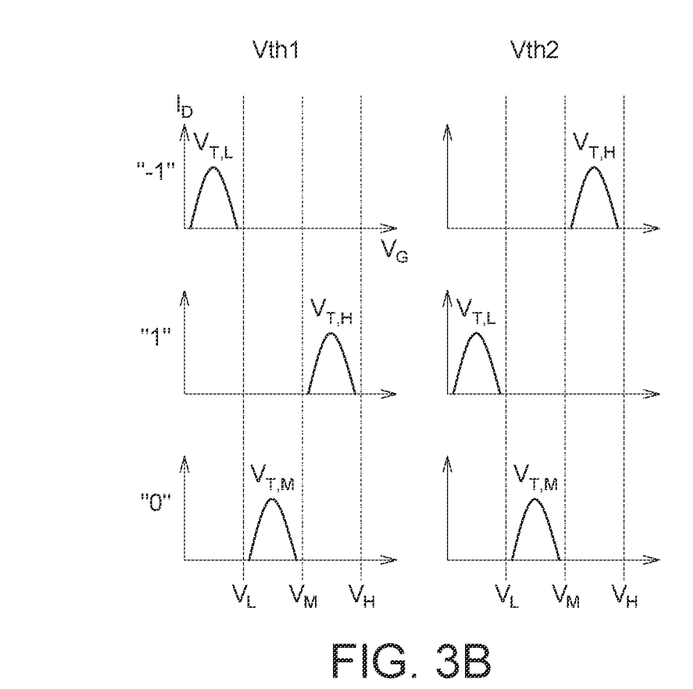

FIG. 3A and FIG. 3B show a second IMS encoding according to one embodiment of the application. In FIG. 3A, the IMS memory cell 300 includes a plurality of memory cells. For example but not limited by, the IMS memory cell 300 includes two memory cells MC1 and MC2, wherein the memory cells MC1 and MC2 are serially connected. The memory cells MC1 and MC2 have threshold voltages of Vth1 and Vth2, respectively, and gates of the memory cells MC1 and MC2 are coupled to the word lines WL1 and WL2, respectively. In here, the memory cells MC1 and MC2 are N-type memory cells but the application is not limited by this. In other possible embodiments of the application, the memory cells MC1 and MC2 may be P-type memory cells, which are within the spirit and scope of the application.

As shown in FIG. 3B, the data string encoded by the first IMS encoding is further encoded by the second IMS encoding. Details of the second IMS encoding are as follows. The second IMS encoding is to encode the search data into the search voltages, and to encode the storage data into the threshold voltages. When the search data is logic 0, the search voltages applied to the word lines WL1 and WL2 are $V_M$ and $V_M$, respectively. When the search data is logic 1, the search voltages applied to the word lines WL1 and WL2 are $V_H$ and $V_L$, respectively. When the search data is logic −1, the search voltages applied to the word lines WL1 and WL2 are $V_L$ and $V_H$, respectively. $V_L<V_M<V_H$. $V_L$, $V_M$ and $V_H$ are also referred as first, second and third reference search voltages. When the storage data of the IMS memory cell 300 is logic 0, the threshold voltages of the memory cells MC1 and MC2 are Vth1=$V_{T, M}$ and Vth2=$V_{T, M}$, respectively. When the storage data of the IMS memory cell 300 is logic 1, the threshold voltages of the memory cells MC1 and MC2 are Vth1=$V_{T, H}$ and Vth2=$V_{T, L}$, respectively. When the storage data of the IMS memory cell 300 is logic −1, the threshold voltages of the memory cells MC1 and MC2 are Vth1=$V_{T, L}$ and Vth2=$V_{T, H}$, respectively. $V_{T, L}<V_{T, M}<V_{T, H}$. $V_{T, L}$, $V_{T, M}$ and $V_{T, H}$ are also referred as first, second and third reference threshold voltages.

Alternatively, in other possible embodiment of the application, when the search data is logic 0, the search voltages applied to the word lines WL1 and WL2 are $V_M$ and $V_M$, respectively. When the search data is logic 1, the search voltages applied to the word lines WL1 and WL2 are $V_L$ and $V_H$, respectively. When the search data is logic −1, the search voltages applied to the word lines WL1 and WL2 are $V_H$ and $V_L$, respectively. When the storage data of the IMS memory cell 300 is logic 0, the threshold voltages of the memory cells MC1 and MC2 are Vth1=$V_{T, M}$ and Vth2=$V_{T, M}$, respectively. When the storage data of the IMS memory cell 300 is logic 1, the threshold voltages of the memory cells MC1 and MC2 are Vth1=$V_{T, L}$ and Vth2=$V_{T, H}$, respectively. When the storage data of the IMS memory cell 300 is logic −1, the threshold voltages of the memory cells MC1 and MC2 are Vth1=$V_{T, H}$ and Vth2=$V_{T, L}$, respectively.

In one embodiment of the application, the search data, the search voltage, the storage data and the threshold voltage are as follow:

| Search data | Search voltage (WL1 and WL2) | Storage data | Threshold voltage (Vth1 and Vth2) |
|---|---|---|---|
| 0 | ($V_M$, $V_M$) | 0 | ($V_{T, M}$, $V_{T, M}$) |
| 1 | ($V_H$, $V_L$) or ($V_L$, $V_H$) | 1 | ($V_{T, H}$, $V_{T, L}$) or ($V_{T, L}$, $V_{T, H}$) |
| −1 | ($V_L$, $V_H$) or ($V_H$, $V_L$) | −1 | ($V_{T, L}$, $V_{T, H}$) or ($V_{T, H}$, $V_{T, L}$) |

In FIG. 3B, when the search data logic "0" searches the IMS memory cell 300 having the storage data logic "0", the memory cells MC1 and MC2 are both turned on and thus the IMS memory cell 300 generates a match current. When the search data logic "0" searches the IMS memory cell 300 having the storage data logic "1", the memory cell MC1 is turned off while the memory cell MC2 is turned on and thus the IMS memory cell 300 generates a mismatch current. When the search data logic "0" searches the IMS memory cell 300 having the storage data logic "−1", the memory cell MC1 is turned on while the memory cell MC2 is turned off and thus the IMS memory cell 300 generates the mismatch current. The match current is much higher than the mismatch current. Others are so on.

That is, based on whether the IMS memory cell 300 generates the match current or the mismatch current, the search result is determined to be matched or mismatched.

Figure 4A:
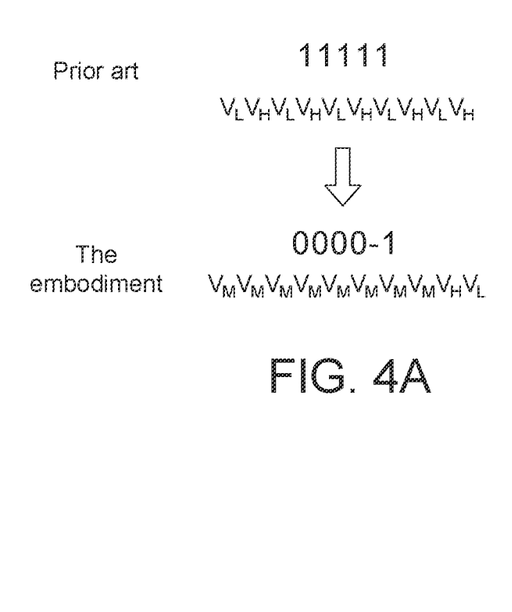
FIG. 4A to FIG. 4C show transverse electric field comparison between the prior art and the embodiment of the application.
Figure 4B:
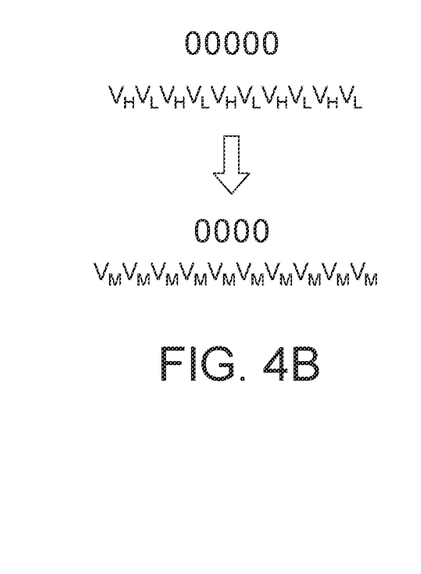
Figure 4C:
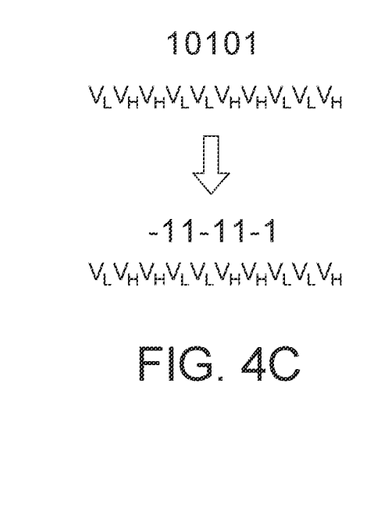

FIG. 4A to FIG. 4C show transverse electric field comparison between the prior art and the embodiment of the application. In the prior art of FIG. 4A, when the search data is 11111, the search voltages applied to ten memory cells are $V_L V_H V_L V_H V_L V_H V_L V_H V_L V_H$. Thus, the transverse electric field effect is severe in the prior art of FIG. 4A, which easily causes threshold voltage shift and read failure of the storage data.

In the embodiment of the application shown in FIG. 4A, after the first and the second IMS encoding, the search data 11111 is encoded into 0000-1. Thus, the search voltages applied to ten memory cells are $V_M V_M V_M V_M V_M V_M V_M V_M V_H V_L$. Thus, the transverse electric field effect is not severe in the embodiment of the application shown in FIG. 4A, which improves threshold voltage shift and read failure of the storage data.

In the prior art of FIG. 4B, when the search data is 00000, the search voltages applied to ten memory cells are $V_H V_L V_H V_L V_H V_L V_H V_L V_H V_L$. Thus, the transverse electric field effect is severe in the prior art of FIG. 4B, which easily causes threshold voltage shift and read failure of the storage data.

In the embodiment of the application shown in FIG. 4B, after the first and the second IMS encoding, the search data 00000 is encoded into 00000. Thus, the search voltages applied to ten memory cells are $V_M V_M V_M V_M V_M V_M V_M V_M V_M V_M$. Thus, the transverse electric field effect is not severe in the embodiment of the application shown in FIG. 4B, which improves threshold voltage shift and read failure of the storage data.

In the prior art of FIG. 4C, when the search data is 10101, the search voltages applied to ten memory cells are $V_L V_H V_H V_L V_L V_H V_H V_L V_L V_H$. In the embodiment of the application shown in FIG. 4C, after the first and the second IMS encoding, the search data 10101 is encoded into −11-11−1. Thus, the search voltages applied to ten memory cells are $V_L V_H V_H V_L V_L V_H V_H V_L V_L V_H$.

By comparing FIG. 4A and FIG. 4B, the transverse electric field effect is not severe in the embodiment of the application, which improves threshold voltage shift and read failure of the storage data.

Figure 5A:
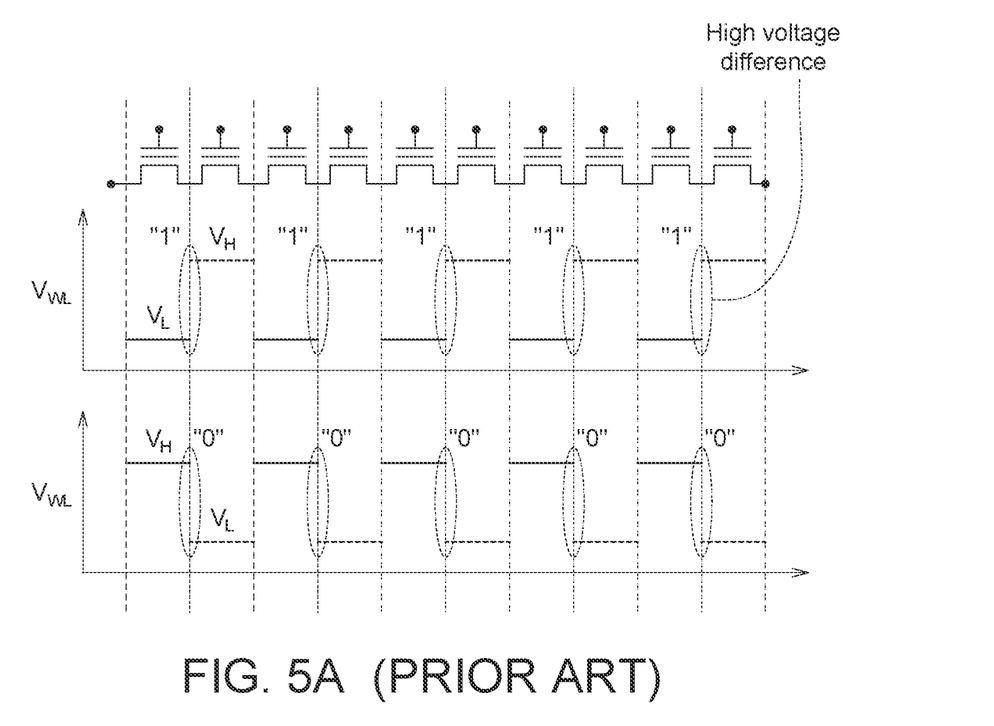
FIG. 5A shows the transverse electric field effect of the prior art.
Figure 5B:
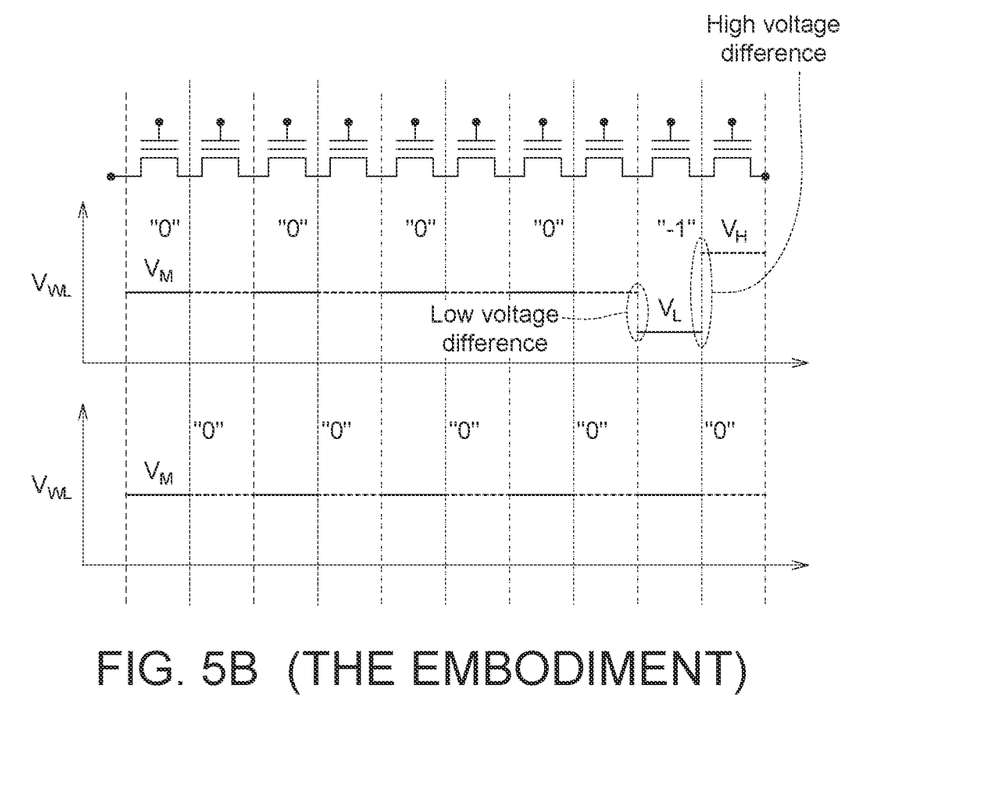
FIG. 5B shows the transverse electric field effect of the embodiment of the application.

FIG. 5A shows the transverse electric field effect of the prior art and FIG. 5B shows the transverse electric field effect of the embodiment of the application. As shown in FIG. 5A, in the prior art, when the search data is 11111 or 00000, the search voltages applied to ten memory cells are $V_L V_H V_L V_H V_L V_H V_L V_H V_L V_H$ or $V_H V_L V_H V_L V_H V_L V_H V_L V_H V_L$ which has 10 times of high voltage difference.

As shown in FIG. 5B, in the embodiment of the application, when the search data is 11111 or 00000, after encoding, the search data is encoded into 0000-1 or 00000, and the search voltages applied to ten memory cells are $V_M V_M V_M V_M V_M V_M V_M V_M V_H V_L$ or $V_M V_M V_M V_M V_M V_M V_M V_M V_M V_M$, which has much fewer or zero times of high voltage difference.

By comparing FIG. 5A and FIG. 5B, the transverse electric field effect is not severe in the embodiment of the application, which improves threshold voltage shift and read failure of the storage data.

Figure 6:
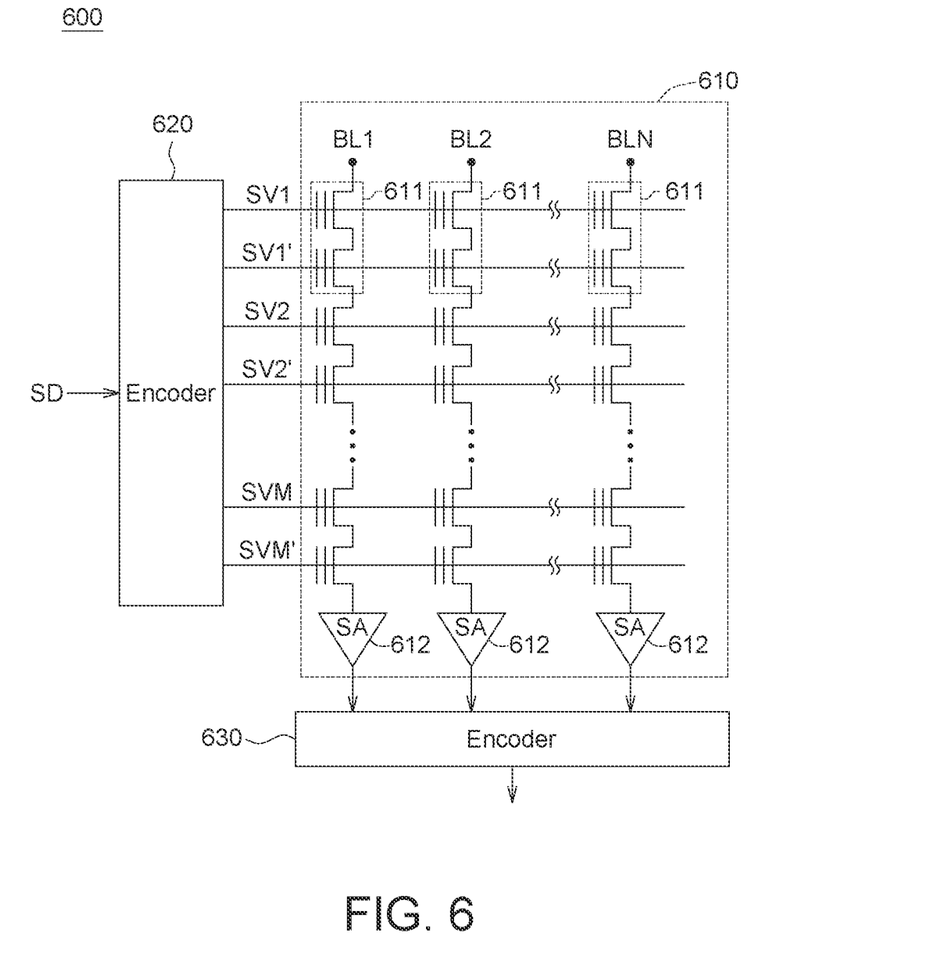
FIG. 6 shows a functional block of an IMS memory device according to one embodiment of the application.

FIG. 6 shows a functional block of an IMS memory device according to one embodiment of the application. As shown in FIG. 6, the IMS memory device 600 according to one embodiment of the application includes an IMS memory array 610, a first encoder 620 and a second encoder 630.

The IMS memory array 610 includes a plurality of IMS memory cells 611 and a plurality of sensing amplifiers (SA) 612. The IMS memory cells 611 are arranged in an array. The IMS memory cell 611 is for example the IMS memory cell 300 of FIG. 3A. The IMS memory cells 611 are coupled to N (N being a natural number) bit lines BL1~BLN. The IMS memory cells 611 coupled to the same bit line are belong to the same memory string. Setting of the storage data and the threshold voltages of the IMS memory cells 611 are as FIG. 2C and FIG. 3B. The sensing amplifiers 612 sense currents from the IMS memory cells 611 and send the sensing results to the second encoder 630.

The first encoder 620 is coupled to the IMS memory array 610. The first encoder 620 receives the search data SD and encodes the search data SD into a plurality of search voltages SV1, SV1', SV2, SV2', . . . SVM and SVM' (M being a positive integer). Encoding of the first encoder 620 is as shown in FIG. 2C and FIG. 3B. The search voltages SV1, SV1', SV2, SV2', . . . SVM and SVM' are applied to the IMS memory cells 611 to search the IMS memory cells 611.

The second encoder 630 is coupled to the IMS memory array 610. The second encoder 630 receives the sensing results from the sensing amplifiers 612 to determine whether the search data SD is matched with the memory strings.

Via the IMS memory device 600 of FIG. 6, the search data SD searches N memory strings of the IMS memory array 610 at the same time; and the second encoder 630 determines whether the search data SD is matched with the memory strings and generates each match result of the memory strings.

Figure 7:
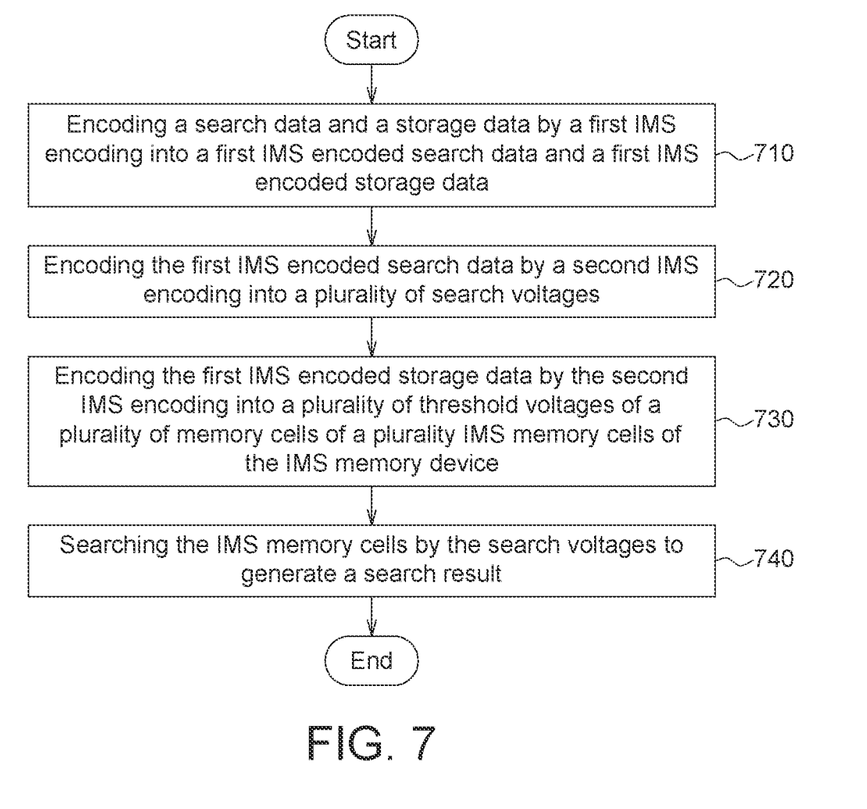
FIG. 7 shows an IMS method according to one embodiment of the application.

FIG. 7 shows an IMS method according to one embodiment of the application. The IMS method according to one embodiment of the application includes: (710) encoding a search data and a storage data by a first IMS encoding into a first IMS encoded search data and a first IMS encoded storage data; (720) encoding the first IMS encoded search data by a second IMS encoding into a plurality of search voltages; (730) encoding the first IMS encoded storage data by the second IMS encoding into a plurality of threshold voltages of a plurality of memory cells of a plurality IMS memory cells of the IMS memory device; and (740) searching the IMS memory cells by the search voltages to generate a search result.

The embodiment of the application is applied in not only planar NAND memory array but also 3D NAND memory array, or other memory array having serially-connected memory cells.

The embodiment of the application is applied in not only stand-alone memory device but also embedded memory device.

The memory cells of the IMS memory cell are for example but not limited by, Silicon-Oxide-Nitride-Oxide-Silicon (SONOS) memory cells, floating-gate memory cells, Ferroelectric RAM (FeRAM) etc.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An in-memory search (IMS) memory cell comprising:
   a first memory cell and a second memory cell coupled to each other, the first memory cell and the second memory cell having a first threshold voltage and a second threshold voltage, respectively, the first memory cell and the second memory cell coupled to a first word line and a second word line, respectively;
   wherein
   a search data and a storage data are encoded by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data;
   the first IMS encoded search data is encoded by a second IMS encoding into a plurality of search voltages;
   the first IMS encoded storage data is encoded by the second IMS encoding into the first threshold voltage and the second threshold voltage; and
   the IMS memory cell is searched by the search voltages to generate a search result.

2. The IMS memory cell according to claim 1, wherein in the first IMS encoding:
   the dummy bit is logic 0;
   in grouping the data string having the dummy bit, the data string has j bits (j being a positive integer), a i-th (i=1~j, i being a positive integer) bit and a (i+1)-th bit are grouped into the same bit group, the data string having the dummy bit is grouped into j bit groups; and
   in encoding the bit groups to generate the first IMS encoded data string, when the bit group is logic "00", the bit group is encoded into logic "0"; when the bit group is logic "01", the bit group is encoded into logic "1"; when the bit group is logic "10", the bit group is encoded into logic "−1"; and when the bit group is logic "11", the bit group is encoded into logic "0".

3. The IMS memory cell according to claim 2, wherein in the second IMS encoding:
   when the first IMS encoded search data is logic 0, among the plurality of search voltages, a first and a second search voltages applied to the first and the second word lines are both a second reference search voltage;
   when the first IMS encoded search data is logic 1, the first and the second search voltages applied to the first and the second word lines are a third reference search voltage and a first reference search voltage, respectively; and
   when the first IMS encoded search data is logic −1, the first and the second search voltages applied to the first and the second word lines are the first reference search voltage and the third reference search voltage, respectively,
   wherein the first reference search voltage is lower than the second reference search voltage and the second reference search voltage is lower than the third reference search voltage.

4. The IMS memory cell according to claim 3, wherein in the second IMS encoding:
   when the first IMS encoded storage data is logic 0, the first and the second threshold voltages are both a second reference threshold voltage;

when the first IMS encoded storage data is logic 1, the first and the second threshold voltages are a third reference threshold voltage and a first reference threshold voltage, respectively; and when the first IMS encoded storage data is logic −1, the first and the second threshold voltages are the first reference threshold voltage and the third reference threshold voltage, respectively, wherein the first reference threshold voltage is lower than the second reference threshold voltage and the second reference threshold voltage is lower than the third reference threshold voltage.

5. The IMS memory cell according to claim 2, wherein in the second IMS encoding:

when the first IMS encoded search data is logic 0, among the plurality of search voltages, a first and a second search voltages applied to the first and the second word lines are both a second reference search voltage;

when the first IMS encoded search data is logic 1, the first and the second search voltages applied to the first and the second word lines are a first reference search voltage and a third reference search voltage, respectively; and when the first IMS encoded search data is logic −1, the first and the second search voltages applied to the first and the second word lines are the third reference search voltage and the first reference search voltage, respectively, wherein the first reference search voltage is lower than the second reference search voltage and the second reference search voltage is lower than the third reference search voltage.

6. The IMS memory cell according to claim 5, wherein in the second IMS encoding:

when the first IMS encoded storage data is logic 0, the first and the second threshold voltages are both a second reference threshold voltage;

when the first IMS encoded storage data is logic 1, the first and the second threshold voltages are a first reference threshold voltage and a third reference threshold voltage, respectively; and when the first IMS encoded storage data is logic −1, the first and the second threshold voltages are the third reference threshold voltage and the first reference threshold voltage, respectively, wherein the first reference threshold voltage is lower than the second reference threshold voltage and the second reference threshold voltage is lower than the third reference threshold voltage.

7. An in-memory search (IMS) method applied to an IMS memory device, the IMS method comprising:

encoding a search data and a storage data by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data;

encoding the first IMS encoded search data by a second IMS encoding into a plurality of search voltages;

encoding the first IMS encoded storage data by the second IMS encoding into a plurality of threshold voltages of a plurality of memory cells of a plurality IMS memory cells of the IMS memory device; and searching the IMS memory cells by the search voltages to generate a search result.

8. The IMS method according to claim 7, wherein in the first IMS encoding:

the dummy bit is logic 0;

in grouping the data string having the dummy bit, the data string has j bits (j being a positive integer), a i-th (i=1~j, i being a positive integer) bit and a (i+1)-th bit are grouped into the same bit group, the data string having the dummy bit is grouped into j bit groups; and in encoding the bit groups to generate the first IMS encoded data string, when the bit group is logic "00", the bit group is encoded into logic "0"; when the bit group is logic "01", the bit group is encoded into logic "1"; when the bit group is logic "10", the bit group is encoded into logic "−1"; and when the bit group is logic "11", the bit group is encoded into logic "0".

9. The IMS method according to claim 8, wherein the IMS memory cell includes a first memory cell and a second memory cell among the plurality of memory cells, the first memory cell and the second memory cell are coupled to each other, the first memory cell and the second memory cell have a first threshold voltage and a second threshold voltage, respectively, the first memory cell and the second memory cell are coupled to a first word line and a second word line, respectively, in the second IMS encoding:

when the first IMS encoded search data is logic 0, among the plurality of search voltages, a first and a second search voltages applied to the first and the second word lines are both a second reference search voltage;

when the first IMS encoded search data is logic 1, the first and the second search voltages applied to the first and the second word lines are a third reference search voltage and a first reference search voltage, respectively; and when the first IMS encoded search data is logic −1, the first and the second search voltages applied to the first and the second word lines are the first reference search voltage and the third reference search voltage, respectively, wherein the first reference search voltage is lower than the second reference search voltage and the second reference search voltage is lower than the third reference search voltage.

10. The IMS method according to claim 9, wherein in the second IMS encoding:

when the first IMS encoded storage data is logic 0, the first and the second threshold voltages are both a second reference threshold voltage;

when the first IMS encoded storage data is logic 1, the first and the second threshold voltages are a third reference threshold voltage and a first reference threshold voltage, respectively; and when the first IMS encoded storage data is logic −1, the first and the second threshold voltages are the first reference threshold voltage and the third reference threshold voltage, respectively, wherein the first reference threshold voltage is lower than the second reference threshold voltage and the second reference threshold voltage is lower than the third reference threshold voltage.

11. The IMS method according to claim 8, wherein
the IMS memory cell includes a first memory cell and a second memory cell among the plurality of memory cells, the first memory cell and the second memory cell are coupled to each other, the first memory cell and the second memory cell have a first threshold voltage and a second threshold voltage, respectively, the first memory cell and the second memory cell are coupled to a first word line and a second word line, respectively, in the second IMS encoding:
when the first IMS encoded search data is logic 0, among the plurality of search voltages, a first and a second search voltages applied to the first and the second word lines are both a second reference search voltage;
when the first IMS encoded search data is logic 1, the first and the second search voltages applied to the first and the second word lines are a first reference search voltage and a third reference search voltage, respectively; and
when the first IMS encoded search data is logic −1, the first and the second search voltages applied to the first and the second word lines are the third reference search voltage and the first reference search voltage, respectively,
wherein the first reference search voltage is lower than the second reference search voltage and the second reference search voltage is lower than the third reference search voltage.

12. The IMS method according to claim 11, wherein in the second IMS encoding:
when the first IMS encoded storage data is logic 0, the first and the second threshold voltages are both a second reference threshold voltage;
when the first IMS encoded storage data is logic 1, the first and the second threshold voltages are a first reference threshold voltage and a third reference threshold voltage, respectively; and
when the first IMS encoded storage data is logic −1, the first and the second threshold voltages are the third reference threshold voltage and the first reference threshold voltage, respectively,
wherein the first reference threshold voltage is lower than the second reference threshold voltage and the second reference threshold voltage is lower than the third reference threshold voltage.

13. An in-memory search (IMS) memory device comprising:
an IMS memory array including a plurality of IMS memory cells;
a first encoder coupled to the IMS memory array, the first encoder receiving a search data and encoding the search data into a plurality of search voltages, the search voltages applied to the IMS memory cells to search the IMS memory cells; and
a second encoder coupled to the IMS memory array, based on a plurality of sensing currents from the IMS memory cells, the second encoder determining whether the search data is matched with a storage data of the IMS memory cells;
wherein
the search data and the storage data are encoded by a first IMS encoding into a first IMS encoded search data and a first IMS encoded storage data, wherein the first IMS encoding including: adding a dummy bit to a data string, grouping the data string having the dummy bit into a plurality of bit groups and encoding the bit groups to generate a first IMS encoded data string, wherein the data string is the search data or the storage data, and the first IMS encoded data string is the first IMS encoded search data or the first IMS encoded storage data;
the first IMS encoded search data is encoded by a second IMS encoding into the plurality of search voltages;
the first IMS encoded storage data is encoded by the second IMS encoding into a plurality of threshold voltages of a plurality of memory cells of the plurality IMS memory cells; and
the IMS memory cells are searched by the search voltages to generate a search result.

14. The IMS memory device according to claim 13, wherein in the first IMS encoding:
the dummy bit is logic 0;
in grouping the data string having the dummy bit, the data string has j bits (j being a positive integer), a i-th (i=1~j, i being a positive integer) bit and a (i+1)-th bit are grouped into the same bit group, the data string having the dummy bit is grouped into j bit groups; and
in encoding the bit groups to generate the first IMS encoded data string, when the bit group is logic "00", the bit group is encoded into logic "0"; when the bit group is logic "01", the bit group is encoded into logic "1"; when the bit group is logic "10", the bit group is encoded into logic "−1"; and when the bit group is logic "11", the bit group is encoded into logic "0".

15. The IMS memory device according to claim 14, wherein
the IMS memory cell includes a first memory cell and a second memory cell among the plurality of memory cells, the first memory cell and the second memory cell are coupled to each other, the first memory cell and the second memory cell have a first threshold voltage and a second threshold voltage, respectively, the first memory cell and the second memory cell are coupled to a first word line and a second word line, respectively, in the second IMS encoding:
when the first IMS encoded search data is logic 0, among the plurality of search voltages, a first and a second search voltages applied to the first and the second word lines are both a second reference search voltage;
when the first IMS encoded search data is logic 1, the first and the second search voltages applied to the first and the second word lines are a third reference search voltage and a first reference search voltage, respectively; and
when the first IMS encoded search data is logic −1, the first and the second search voltages applied to the first and the second word lines are the first reference search voltage and the third reference search voltage, respectively,
wherein the first reference search voltage is lower than the second reference search voltage and the second reference search voltage is lower than the third reference search voltage.

16. The IMS memory device according to claim 15, wherein in the second IMS encoding:
when the first IMS encoded storage data is logic 0, the first and the second threshold voltages are both a second reference threshold voltage;
when the first IMS encoded storage data is logic 1, the first and the second threshold voltages are a third reference threshold voltage and a first reference threshold voltage, respectively; and when the first IMS encoded storage data is logic −1, the first and the second threshold voltages are the first reference threshold voltage and the third reference threshold voltage, respectively, wherein the first reference threshold voltage is lower than the second reference threshold voltage and the second reference threshold voltage is lower than the third reference threshold voltage.

17. The IMS memory device according to claim 14, wherein the IMS memory cell includes a first memory cell and a second memory cell among the plurality of memory cells, the first memory cell and the second memory cell are coupled to each other, the first memory cell and the second memory cell have a first threshold voltage and a second threshold voltage, respectively, the first memory cell and the second memory cell are coupled to a first word line and a second word line, respectively, in the second IMS encoding:

when the first IMS encoded search data is logic 0, among the plurality of search voltages, a first and a second search voltages applied to the first and the second word lines are both a second reference search voltage;

when the first IMS encoded search data is logic 1, the first and the second search voltages applied to the first and the second word lines are a first reference search voltage and a third reference search voltage, respectively; and when the first IMS encoded search data is logic −1, the first and the second search voltages applied to the first and the second word lines are the third reference search voltage and the first reference search voltage, respectively, wherein the first reference search voltage is lower than the second reference search voltage and the second reference search voltage is lower than the third reference search voltage.

18. The IMS memory device according to claim 17, wherein in the second IMS encoding:

when the first IMS encoded storage data is logic 0, the first and the second threshold voltages are both a second reference threshold voltage;

when the first IMS encoded storage data is logic 1, the first and the second threshold voltages are a first reference threshold voltage and a third reference threshold voltage, respectively; and when the first IMS encoded storage data is logic −1, the first and the second threshold voltages are the third reference threshold voltage and the first reference threshold voltage, respectively, wherein the first reference threshold voltage is lower than the second reference threshold voltage and the second reference threshold voltage is lower than the third reference threshold voltage.

\* \* \* \* \*